(12) United States Patent
Huang et al.

(10) Patent No.: US 12,356,550 B2
(45) Date of Patent: Jul. 8, 2025

(54) SANDWICH STRUCTURE POWER SUPPLY MODULE

(71) Applicant: Monolithic Power Systems, Inc., San Jose, CA (US)

(72) Inventors: Daocheng Huang, Santa Clara, CA (US); Wenyang Huang, Hangzhou (CN); Yishi Su, Hangzhou (CN); Yingxin Zhou, Hangzhou (CN); Xinmin Zhang, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 510 days.

(21) Appl. No.: 17/878,356

(22) Filed: Aug. 1, 2022

(65) Prior Publication Data

US 2022/0369464 A1    Nov. 17, 2022

Related U.S. Application Data

(63) Continuation-in-part of application No. 17/589,277, filed on Jan. 31, 2022, which is a continuation-in-part of application No. 17/197,394, filed on Mar. 10, 2021.

(51) Int. Cl.
| | |
|---|---|
| *H05K 1/18* | (2006.01) |
| *H01L 23/367* | (2006.01) |
| *H01L 23/495* | (2006.01) |
| *H01L 23/528* | (2006.01) |
| *H01L 23/66* | (2006.01) |
| *H05K 1/02* | (2006.01) |

(52) U.S. Cl.
CPC ........... *H05K 1/181* (2013.01); *H01L 23/367* (2013.01); *H01L 23/49562* (2013.01); *H01L 23/5286* (2013.01); *H01L 23/66* (2013.01); *H05K 1/0237* (2013.01)

(58) Field of Classification Search
CPC ...................... H05K 1/181; H05K 2201/1003
See application file for complete search history.

(56) References Cited

U.S. PATENT DOCUMENTS

| | | | |
|---|---|---|---|
| 8,064,202 B2 | 11/2011 | Yin et al. | |
| 8,604,597 B2 | 12/2013 | Jiang | |
| 8,742,490 B2 | 6/2014 | Disney | |
| 9,263,177 B1* | 2/2016 | Ikriannikov | ........ H01F 17/0013 |
| 11,158,451 B2* | 10/2021 | Xiong | ................... H02M 3/003 |
| 11,398,333 B2 | 7/2022 | Huang et al. | |
| 11,682,515 B2 | 6/2023 | Huang et al. | |
| 2005/0184372 A1 | 8/2005 | Asahi et al. | |

(Continued)

FOREIGN PATENT DOCUMENTS

| | | |
|---|---|---|
| CN | 203289736 U | 11/2013 |
| CN | 207074591 U | 3/2018 |

(Continued)

*Primary Examiner* — Sherman Ng
(74) *Attorney, Agent, or Firm* — Perkins Coie LLP

(57) ABSTRACT

A power supply module having at least one inductor modules, a top PCB mounted on top of the at least one inductor modules, and at least one pair of power device chips mounted on top of the top PCB, wherein power pins and signal pins for connecting the top PCB and a board that the at least one inductor modules are attached to, are implemented by metal layers wrapping each of the at least one inductor modules.

17 Claims, 15 Drawing Sheets

(56) References Cited

U.S. PATENT DOCUMENTS

| | | | |
|---|---|---|---|
| 2009/0175014 A1* | 7/2009 | Zeng | H05K 1/145 |
| | | | 361/782 |
| 2010/0176909 A1* | 7/2010 | Yasuda | H01F 27/006 |
| | | | 336/233 |
| 2012/0056703 A1 | 3/2012 | Ikriannikov | |
| 2012/0193772 A1 | 8/2012 | Jiang | |
| 2018/0330870 A1 | 11/2018 | Sakai et al. | |
| 2018/0366256 A1 | 12/2018 | Kuo et al. | |
| 2019/0295765 A1 | 9/2019 | Yan et al. | |
| 2020/0113058 A1* | 4/2020 | Xiong | H01R 12/52 |
| 2020/0312766 A1 | 10/2020 | Bhagavat et al. | |
| 2022/0254563 A1 | 8/2022 | Yan | |
| 2022/0285075 A1 | 9/2022 | Zhang et al. | |
| 2022/0295635 A1 | 9/2022 | Huang et al. | |
| 2022/0295638 A1 | 9/2022 | Huang et al. | |
| 2022/0295639 A1 | 9/2022 | Huang et al. | |
| 2023/0269877 A1 | 8/2023 | Huang et al. | |
| 2023/0396158 A1 | 12/2023 | Huang et al. | |

FOREIGN PATENT DOCUMENTS

| | | |
|---|---|---|
| CN | 207074596 U | 3/2018 |
| CN | 207149384 U | 3/2018 |

* cited by examiner

SANDWICH STRUCTURE POWER SUPPLY MODULE

CROSS-REFERENCE TO RELATED APPLICATION(S)

This application is a continuation-in-part of U.S. patent application Ser. No. 17/589,277, filed on Jan. 31, 2022, which is a continuation-in-part of U.S. patent application Ser. No. 17/197,394, filed on Mar. 10, 2021, which are both incorporated herein by reference.

TECHNICAL FIELD

The present invention generally relates to electrical components, and more particularly but not exclusively relates to power supply modules.

BACKGROUND

Power converter, as known in the art, converts an input power to an output power for providing a load with required voltage and current. Multi-phase power converter comprising a plurality of paralleled power stages operating out of phase has lower output ripple voltage, better transient performance and lower ripple-current-rating requirements for input capacitors. They are widely used in high current and low voltage applications, such as server, microprocessor.

With the development of modern GPUs (Graphics Processing Units), and CPUs (Central Processing Units), increasingly high load current is required to achieve better processor performance. However, the size of microprocessor needs to become smaller. Higher current and smaller size put more challenges to the heat conduction. Therefore, high-power density and high-efficiency power converters with excellent heat dissipation path are necessary.

SUMMARY

It is an object of the present invention to provide a sandwich structure power supply module with inductors, power switches and drivers mounted and integrated in a small size power supply module.

The embodiments of the present invention are directed to a sandwich structure power supply module, comprising: an inductor pack having at least one inductor; a top PCB (Printed Circuit Board) on top of the inductor pack; and at least one power device chip on top of the top PCB, wherein each one of the at least one power device chip has at least one pin connected to an associated inductor via the top PCB; wherein the inductor pack is wrapped with metal layers, wherein each two metal layers are lied against to a same surface of the inductor pack, with an isolation layer in between, and wherein the two metal layers are connected to different potentials.

The embodiments of the present invention are directed to an inductor pack, comprising: a magnetic core having two passageways passing through the magnetic core from a top surface to a bottom surface; two windings respectively passing through the two passageways; and two pairs of metal layers, wherein each pair of the metal layer comprises two metal layers lie against to a same side surface of the inductor pack, with an isolation layer in between, and wherein the two metal layers of a pair of the metal layers are connected to different potentials.

The embodiments of the present invention are directed to an inductor pack, comprising: a magnetic core having two passageways passing through the magnetic core from top to bottom; two windings respectively passing through the two passageways; and a first metal layer and a second metal layer respectively lie against to opposite side surface of the magnetic core, and a third metal layer lies against to one of the remaining side surfaces.

The sandwich structure power supply module in the present invention: (1) could save PCB (Printed Circuit Board) footprint compared to the prior art tiled module structure, which improves load current/power density; (2) could minimize the output current trace impedance on PCB and mainly deliver output current through inductor legs to achieve high-efficiency; and (3) with the power device chips on top and inductor pack on bottom structure could largely benefit from the top-side cooling system which is normally adopted by GPU, CPU, ASIC (Application Specific Integrated Circuit) systems.

The inductor pack in the present invention: 1) takes the most advantage of inductor area and thus maximize the inductance value/saturation current; 2) adopts hybrid magnetic core materials to avoid the sharp drop of inductance value at high saturation current. Overall, the inductor pack in the present invention is designed to have low DCR, high inductance at low current for high efficiency, low inductance at high current for good transient performance, and external ground and power legs for high current return path.

BRIEF DESCRIPTION OF THE DRAWINGS

The present invention can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION

Figure 1:
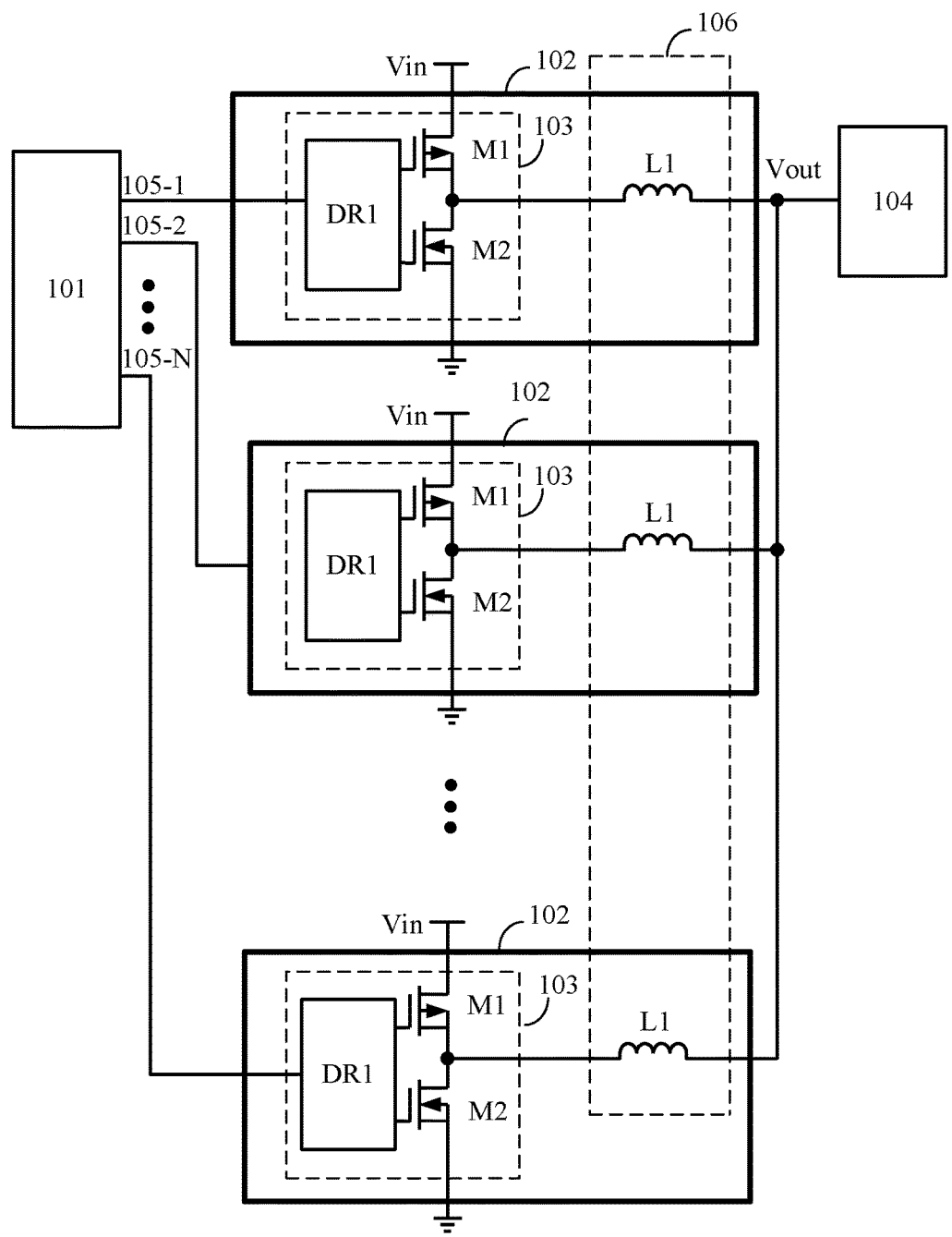
FIG. 1 schematically shows a prior art multi-phase power converter 10 which comprises a controller 101, N power devices 103 and N inductors L1 for supplying power to a load 104.

In the present disclosure, numerous specific details are provided, such as examples of electrical circuits and components, to provide a thorough understanding of embodiments of the invention. Persons of ordinary skill in the art will recognize, however, that the invention can be practiced without one or more of the specific details. It is noted that, for purposes of illustrative clarity, certain elements in the drawings may not be drawn to scale. In other instances, well-known details are not shown or described to avoid obscuring aspects of the invention.

FIG. 1 schematically shows a multi-phase power converter 10 which comprises a controller 101, N power devices 103 and N inductors L1 for supplying power to a load 104, wherein N is an integer, and N>1. Each power device 103 and one inductor L1 represent one power stage, i.e., one phase 102 of the power converter 10, as shown in FIG. 1. Each power device 103 comprises power switches M1, M2 and a driver DR1 for driving the power switches M1 and M2. The controller 101 provides N phase control signals 105-1-105-N respectively to N power devices 103 to control the N phases 102 working out of phase, i.e., the inductors L1 sequentially absorb power from the input source and sequentially deliver power to the load 104. It should be noticed that the outputs of all phases as shown in FIG. 1 are connected to work as a multi-phase converter. However, each phase output may be separated to work as multiple independent converters which could have different output voltage levels for different load demands.

The power stage 102 with Buck topology is shown in FIG. 1 for example. Persons of ordinary skill in the art should appreciate that power stages with other topologies, like Boost topology, Buck-Boost topology could also be adopted in a multi-phase power converter.

The inductors L1 could be implemented by one or a few coupled inductors or could be implemented by N single inductors.

When N=2, the multi-phase power converter 10 is used as a dual-phase power converter or two separate single-phase converters.

Figure 2:
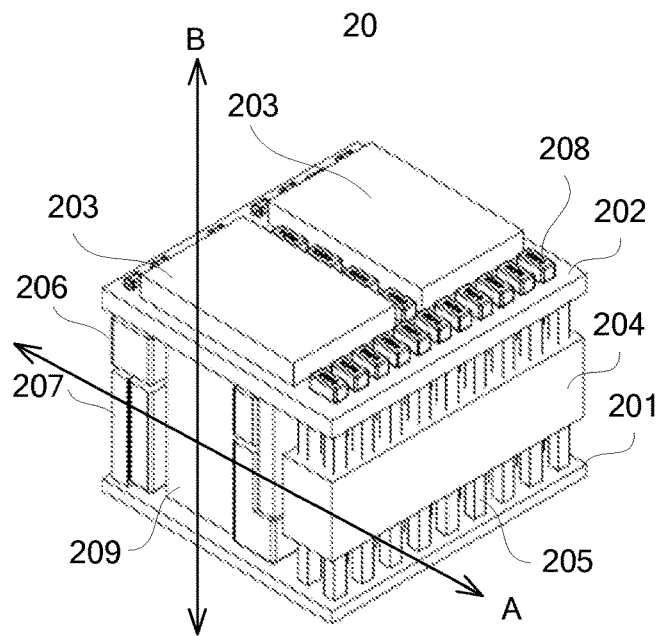
FIG. 2 shows a sandwich structure power supply module 20 for a dual-phase power converter in accordance with an embodiment of the present invention.

FIG. 2 shows a sandwich structure power supply module 20 for a dual-phase power converter in accordance with an embodiment of the present invention. The power supply module 20 may serve as the power stage 102 of FIG. 1, with N=2. The sandwich structure power supply module 20 comprises: a bottom PCB 201 at the bottom of the sandwich structure power supply module 20; an inductor pack 206 having two inductors located on the bottom PCB 201, wherein each inductor has a first end and a second end; a top PCB 202 on the top of the inductor pack 206; a connector 204 placed between the bottom PCB 201 and the top PCB 202, wherein the connector 204 has a plurality of metal pillars 205 respectively connecting solder pads on the bottom PCB to solder pads on the top PCB; and two power device chips 203 on the top of the top PCB 202, wherein each one of the power device chips 203 has one or more than one pins connected to the second end of one inductor of the inductor pack 206 via the top PCB 202; wherein each inductor comprises a winding 207 having ends folded to a plane perpendicular to an axis along a length of the winding 207.

In FIG. 2, the power supply module 20 further comprises the discrete components 208 located on the top PCB 202. The discrete components 208 comprise resistors and capacitors of the power converter 10, like the input capacitors at the input terminal to provide pulse current, the filter capacitors and resistors for driver and internal logic circuits power supplies, etc.

In one embodiment, the metal pillars 205 comprises copper pillars for soldering the bottom PCB 201 to the top PCB 202. Persons of ordinary skill in the art should appreciate that the metal pillars 205 could be made of any known material for soldering one PCB to another PCB.

The power supply module 20 is utilized to a mainboard PCB to supply power to the devices on the mainboard PCB. The bottom PCB 201 is soldered to the mainboard PCB to connect the necessary pins of the power supply module 20 to the mainboard PCB. In some embodiments, the bottom PCB 201 could be saved. The connector 204 and the inductor pack 206 are soldered to the mainboard PCB directly.

In the present invention, the inductors and the power device chips are mounted to save the footprint on a PCB integrating the power converter 10 and the devices powered by the power converter 10. Each power device chip 203 integrates the power device 103 in FIG. 1, which comprises the power switches M1, M2, the driver DR1, and further integrates some auxiliary circuits not shown in FIG. 1. The pins of the power device chips 203 are connected to the solder pads on the bottom PCB 201 via the top PCB 202, the inductor pack 206 and the connector 204, to make sure that all the necessary signals could be obtained from the bottom PCB 201. Furthermore, for the signals with large current, like ground reference, the power supply module 20 provides metal layers 209. The metal layers 209 solders the top PCB 202 to the bottom PCB 201. The metal layer 209 coats part of a magnetic core of the inductor pack 206. The location of the metal layer 209 is determined by the location of ground reference pins of the power device chips 203. In the example of FIG. 2, since the metal layers 209 are placed at the side of the inductor pack 206, the ends of the metal layers 209 are bent to produce tabs close to the ground reference pins of the power device chips 203, so that to carry high current in the horizontal direction through metal tabs instead of PCB traces which lowers conduction loss and improve efficiency.

Figure 3:
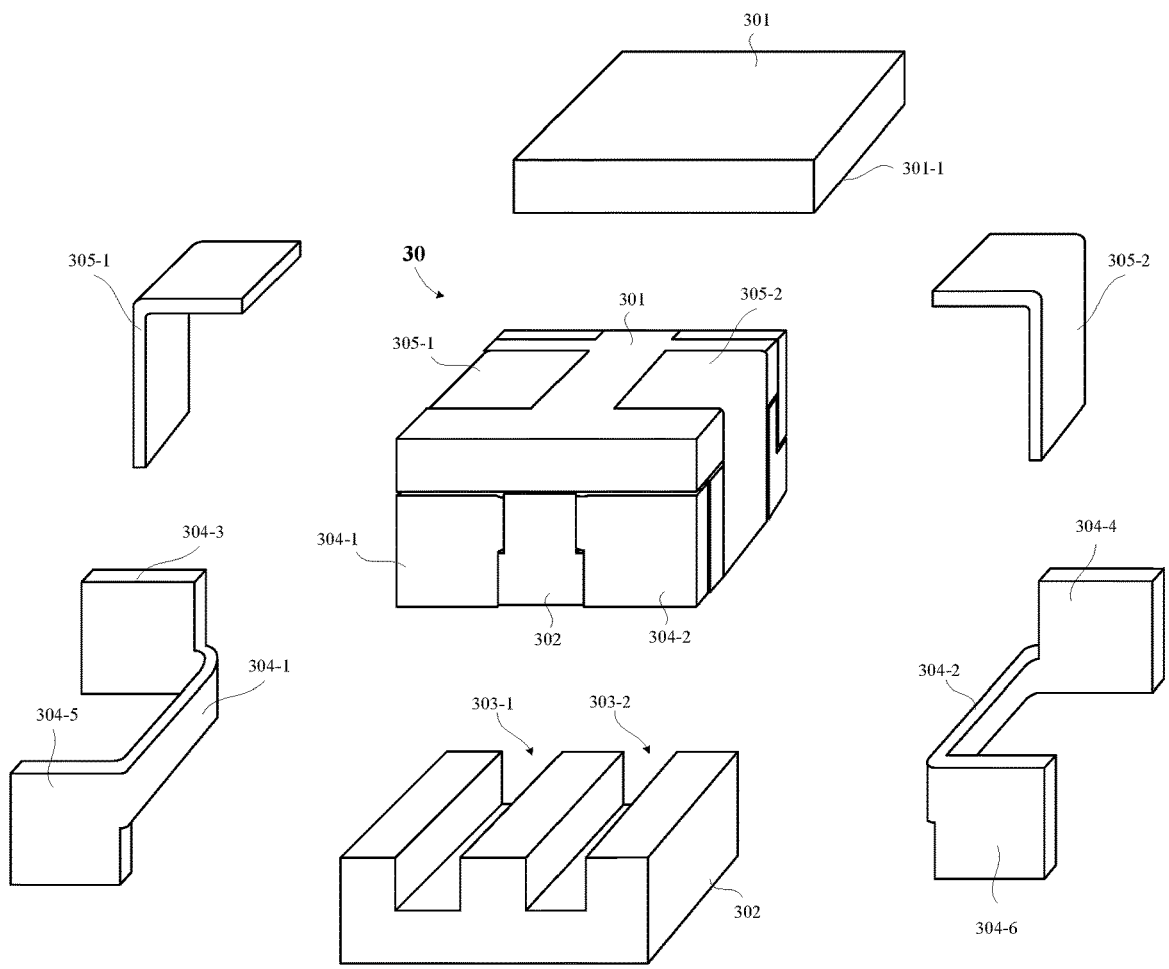
FIG. 3 shows the disassemble view of an inductor pack 30 in accordance with an embodiment of the present invention.

FIG. 3 shows the disassembled view of an inductor pack 30 in accordance with an embodiment of the present invention. The inductor pack 30 may serve as the inductor pack 206 in FIG. 2. As shown in FIG. 3, the inductor pack 30 comprises: a magnetic core having a first magnetic core part 301 and a second magnetic core part 302, wherein the first magnetic core part 301 and the second magnetic core part 302 are assembled to have two passageways 303-1 and 303-2 at a planer where the first magnetic core part 301 and the second magnetic core part 302 are aligned; and two windings 304-1 and 304-2 respectively passing through two passageways 303-1 and 303-2 between the first magnetic core part 301 and the second magnetic core part 302.

In the embodiment of FIG. 3, the passageways 303-1 and 303-2 have a depth along an axis A parallel to the bottom PCB 201 and the top PCB 202 shown in FIG. 2.

In the embodiment of FIG. 3, the winding 304-1 has a first end 304-3 bent 90 degrees to cover a surface of the magnetic core and extended along the top PCB 202 to be soldered to the top PCB 202, and a second end 304-5 bent 90 degrees to cover a surface of the magnetic core and extended along the bottom PCB 201 to be soldered to the bottom PCB 201, and wherein the first end 304-3 and the second end 304-5 of the winding 304-1 are extended at a plane perpendicular to an axis along the depth of the passageways 303-1 and 303-2 of the magnetic core. Similarly, the winding 304-2 has a first end 304-4 bent 90 degrees to cover a surface of the magnetic core and extended along the top PCB 202 to be soldered to the top PCB 202, and a second end 304-6 bent 90 degrees to cover a surface of the magnetic core and extended along the bottom PCB 201 to be soldered to the bottom PCB 201, and wherein the first end 304-4 and the second end 304-6 of the winding 304-2 are extended at a plane perpendicular to an axis along the depth of the passageways 303-1 and 303-2 of the magnetic core.

In the embodiment of FIG. 3, the magnetic core has a first magnetic core part 301 and a second magnetic core part 302 which are asymmetrical, wherein the first magnetic core part 301 is in a planar shape and the second magnetic core part 302 has two trenches, and wherein the passageways 303-1, 303-2 is respectively formed by a trench of the second magnetic core 302 and a surface 301-1 of the first magnetic core 301.

In the embodiment of FIG. 3, the metal layers 305-1 and 305-2 have a L-shape. The metal layers 305-1 and 305-2 are configured to solder the top PCB 202 to the bottom PCB 201. The ends of the metal layers 305-1 and 305-2 for soldering the top PCB 202 are bent 90 degrees and extended to produce tabs to be soldered to the ground reference pins of the power device chips 203 via the top PCB 202 with minimized PCB trace impedance inside the top PCB.

Figure 4:
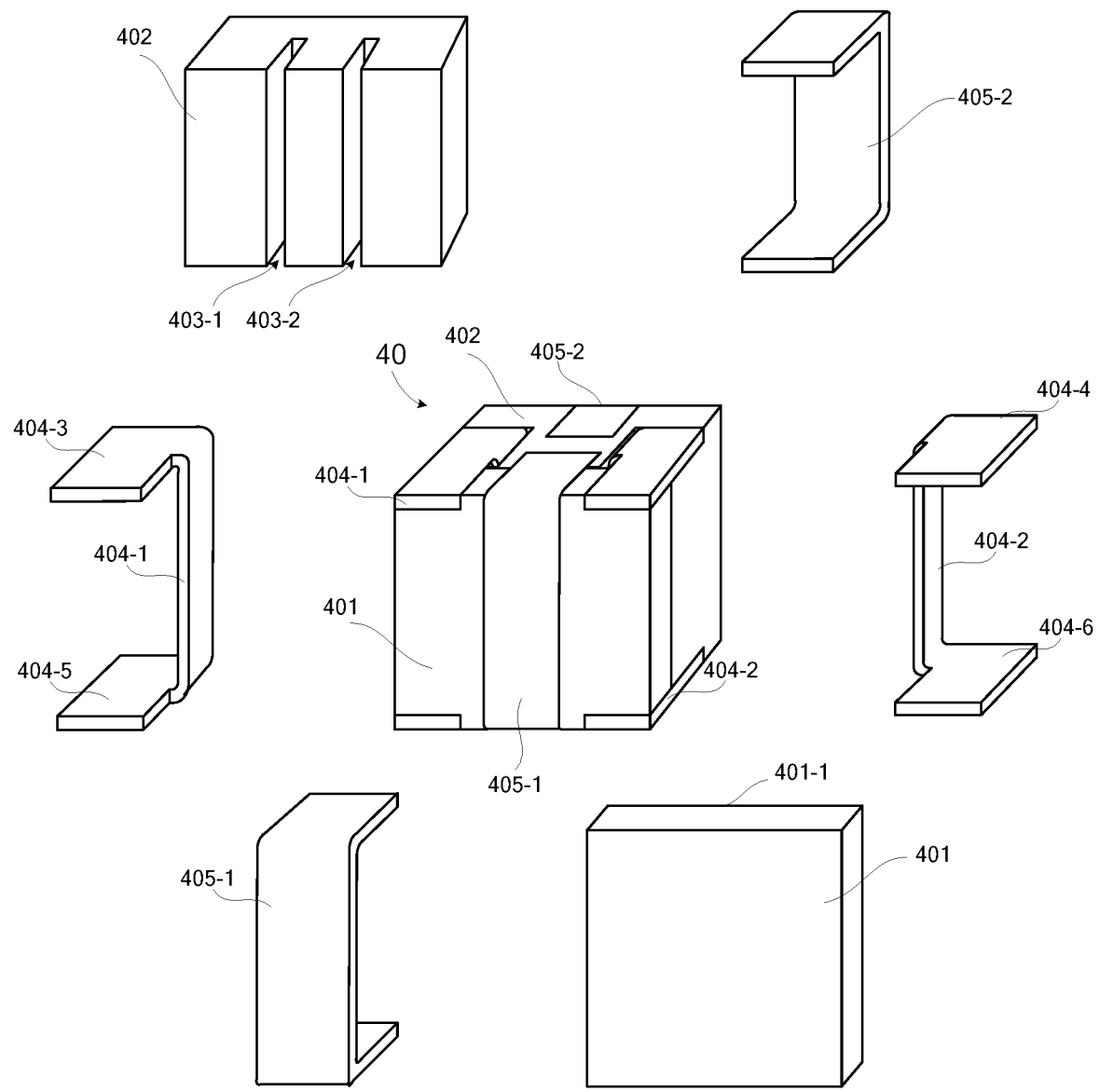
FIG. 4 shows the disassemble view of an inductor pack 40 in accordance with an embodiment of the present invention.

FIG. 4 shows the disassembled view of an inductor pack 40 in accordance with an embodiment of the present invention. The inductor pack 40 may serve as the inductor pack 206 in FIG. 2. As shown in FIG. 4, the inductor pack 40 comprises: a magnetic core having a first magnetic core part 401 and a second magnetic core part 402, wherein the first magnetic core part 401 and the second magnetic core part 402 are assembled to have two passageways 403-1 and 403-2 at a planer where the first magnetic core part 401 and the second magnetic core part 402 are aligned; and two windings 404-1 and 404-2 respectively passing through two passageways 403-1 and 403-2 between the first magnetic core part 401 and the second magnetic core part 402.

In the embodiment of FIG. 4, the passageways 403-1 and 403-2 have a depth along an axis B perpendicular to the bottom PCB 201 and the top PCB 202 if adopted by the power supply module 20 in FIG. 2.

In the embodiment of FIG. 4, the winding 404-1 has a first end 404-3 bent 90 degrees to cover a surface of the magnetic core and extended along a surface of the top PCB 202 to be soldered to the top PCB 202, and a second end 404-5 bent 90 degrees to cover a surface of the magnetic core and extended along a surface of the bottom PCB 201 to be soldered to the bottom PCB 201, and wherein the first end 404-3 and the second end 404-5 of the winding 404-1 are extended at a plane perpendicular to an axis along the depth of the passageways 403-1 and 403-2 of the magnetic core. Similarly, the winding 404-2 has a first end 404-4 bent 90 degrees to cover a surface of the magnetic core and extended along a surface of the top PCB 202 to be soldered to the top PCB 202, and a second end 404-6 bent 90 degrees to cover a surface of the magnetic core and extended along a surface of the bottom PCB 201 to be soldered to the bottom PCB 201, and wherein the first end 404-4 and the second end 404-6 of the winding 404-2 are extended at a plane perpendicular to an axis along the depth of the passageways 403-1 and 403-2 of the magnetic core.

In some embodiments, the second end 404-5 of the windings 404-1, and the second end 404-6 of the windings 404-2 are not bent. Whether the second ends of the winding are bent or not, and the locations, shapes of the second ends of the windings, are determined by the locations of the associated solder pads on the bottom PCB of the power supply module, or the associated solder pads on the mainboard PCB if the bottom PCB is saved.

In the embodiment of FIG. 4, the magnetic core has a first magnetic core part 401 and a second magnetic core part 402 which are asymmetrical, wherein the first magnetic core part 401 is in a planar shape and the second magnetic core part 402 has two trenches, and wherein each of the passageways 403-1, 403-2 is respectively formed by a trench of the second magnetic core 402 and a surface 401-1 of the first magnetic core 401.

In the embodiment of FIG. 4, the metal layers 405-1 and 405-2 have a C-shape. The metal layers 405-1 and 405-2 are configured to solder the top PCB 202 to the bottom PCB 201. The ends of the metal layers 405-1 and 405-2 for soldering the bottom PCB 201 are bent 90 degrees and extended to produce tabs to be soldered to the bottom PCB 201 with minimized PCB trace impedance inside the bottom PCB 201. Also, the ends of the metal layers 405-1 and 405-2 for soldering the top PCB 202 are bent 90 degrees and extended to produce tabs to be soldered to the ground reference pins of the power device chips 203 via the top PCB 202 with minimized PCB trace impedance inside the top PCB 202.

Figure 5:
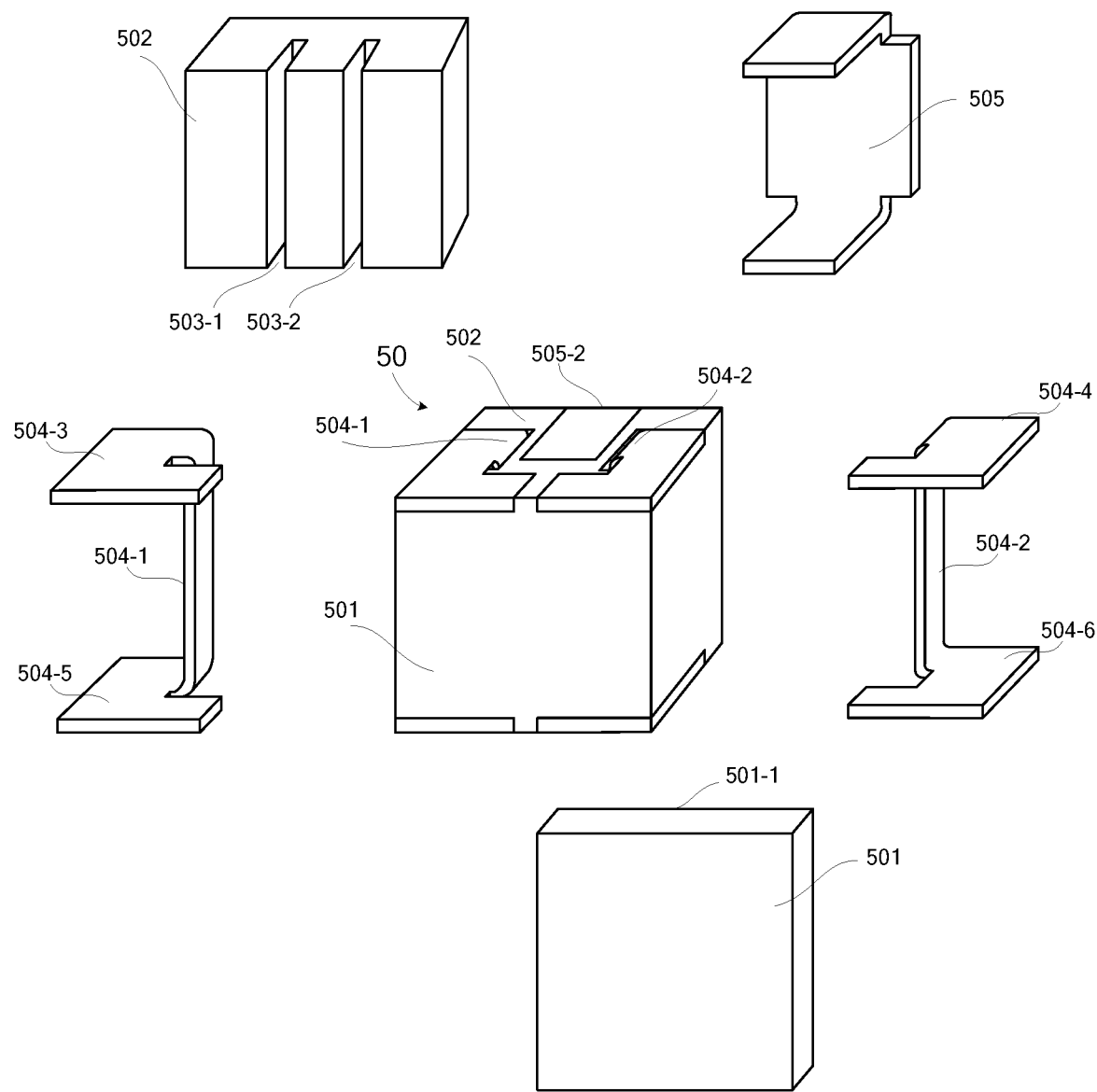
FIG. 5 shows the disassembled view of an inductor pack 50 in accordance with an embodiment of the present invention.

FIG. 5 shows the disassembled view of an inductor pack 50 in accordance with an embodiment of the present invention. The inductor pack 50 may serve as the inductor pack 206 in FIG. 2. As shown in FIG. 5, the inductor pack 50 comprises: a magnetic core having a first magnetic core part 501 and a second magnetic core part 502, wherein the first magnetic core part 501 and the second magnetic core part 502 are assembled to have two passageways 503-1 and 503-2 at a planer where the first magnetic core part 501 and the second magnetic core part 502 are aligned; and two windings 504-1 and 504-2 respectively passing through two passageways 503-1 and 503-2 between the first magnetic core part 501 and the second magnetic core part 502.

In the embodiment of FIG. 5, the passageways 503-1 and 503-2 have a depth along an axis B perpendicular to the bottom PCB 201 and the top PCB 202 if adopted by the power supply module 20 in FIG. 2.

In the embodiment of FIG. 5, the metal layer 505 has a C-shape. The metal layer 505 is configured to solder the top PCB 202 to the bottom PCB 201. The end of the metal layer 505 for soldering the bottom PCB 201 are bent 90 degrees and extended to produce tabs to be soldered to the bottom PCB 201 with minimized PCB trace impedance inside the bottom PCB 201. Also, the end of the metal layer 505 for soldering the top PCB 202 are bent 90 degrees and extended to produce tabs to be soldered to the ground reference pins of the power device chips 203 via the top PCB 202 with minimized PCB trace impedance inside the top PCB 202. In the example of FIG. 5, the middle part of the metal layer 505 are extended to both sides to lower the impedance of the metal layer 505.

Compared with the inductor pack 40 in FIG. 4, the inductor pack 50 in FIG. 5 has one metal layer 505 for soldering the ground reference pins from the top PCB 202 to the bottom PCB 201. Since the area for another ground metal layer as in FIG. 4 is saved, the ends of the windings in the embodiment of FIG. 5 extend to larger areas at the top and the bottom of the inductor pack 50, which makes the power device chips 203 have more flexibility to configure pins.

The magnetic core having a first magnetic core part 501 and a second magnetic core part 502 in the embodiment of FIG. 5 is similar to the magnetic core in the embodiment of FIG. 4, and is not described here for brevity.

Figure 6:
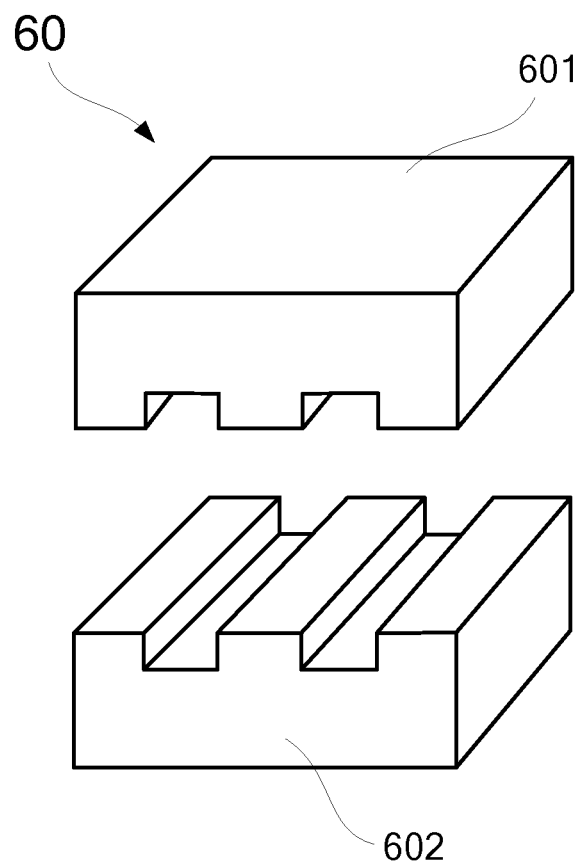
FIG. 6 shows a magnetic core 60 in accordance with an embodiment of the present invention.

FIG. 6 shows a magnetic core 60 in accordance with an embodiment of the present invention. In FIG. 6, the magnetic core 60 comprises a first magnetic core part 601 and a second magnetic core part 602 which are symmetrical, wherein each one of the magnetic core parts has two trenches. When the magnetic core 60 is adopted by the inductor pack 30 in FIG. 3, the inductor pack 40 in FIG. 4, or the inductor pack 50 in FIG. 5, each passageway for passing a winding is formed by a trench of the first magnetic core part 601 and a trench of the second magnetic core part 602.

Figure 7:
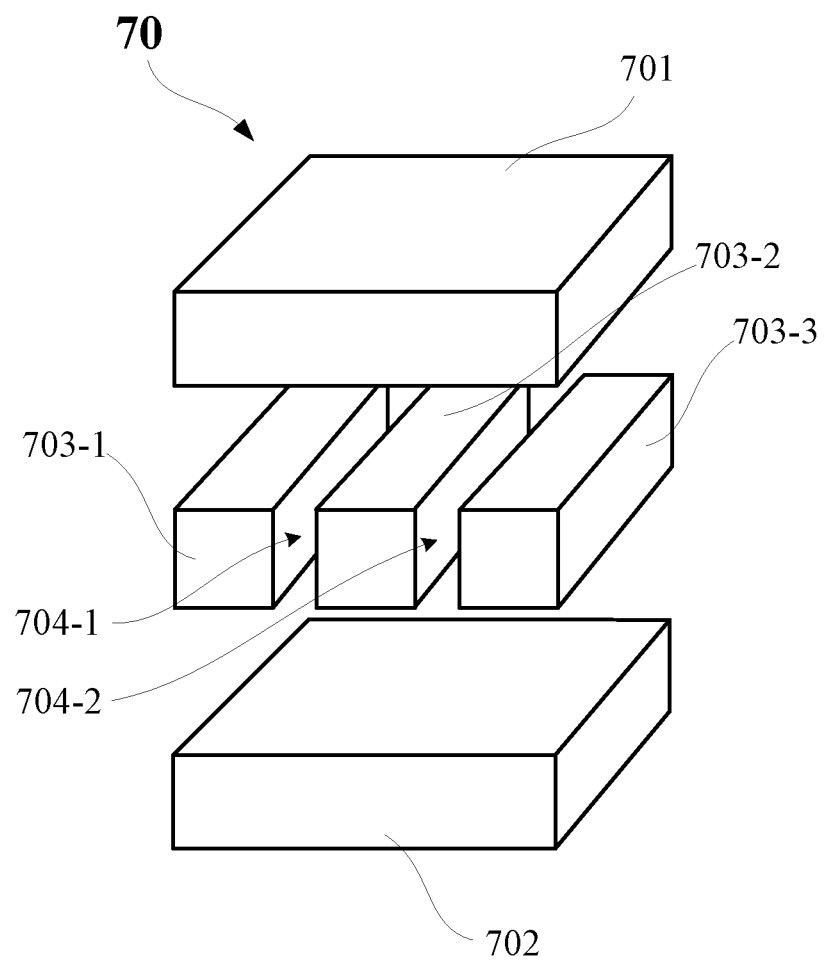
FIG. 7 shows a magnetic core 70 in accordance with an embodiment of the present invention.

FIG. 7 shows a magnetic core 70 in accordance with an embodiment of the present invention. In FIG. 7, the magnetic core 70 comprises a first magnetic core part 701, a second magnetic core part 702 and third magnetic core parts 703-1~703-3. The first magnetic core part 701, the second magnetic core part 702 and the third magnetic core parts 703-1 and 703-2 forms a passageway 704-1. The first magnetic core part 701, the second magnetic core part 702 and the third magnetic core parts 703-2 and 703-3 forms a passageway 704-2. More passageways could be formed when there are more third magnetic core parts. The first magnetic core part 701, the second magnetic core part 702 and the third magnetic core parts 703-1~703-3 could be made of different materials to provide a more flexible inductance-current curve.

In some embodiments of the present invention, the magnetic core parts of the magnetic core may be made of the same material, but have different geometries and/or percent composition to meet an inductance-current requirement of a target inductance profile, e.g., high inductance at low currents and low inductance at high currents. High inductance at low currents allows for higher efficiency, while low inductance at high currents allows for better transient response. In some embodiments, the magnetic core parts of the magnetic core may be made of different materials, like ferrite, iron powder, and any other suitable magnetic material to obtain a target inductance profile.

The inductor pack 30 in FIG. 3, the inductor pack 40 in FIG. 4 and the inductor pack 50 in FIG. 5 show magnetic cores with two windings respectively passing through two passageways of the magnetic cores for illustration. Persons of ordinary skill in the art should appreciate that the magnetic cores of the present invention could have any number of passageways and the corresponding windings according to the application requirement, like, one, or more than two.

In some embodiments, a gap may exist between the magnetic core parts of the magnetic core to form a coupled inductor. In some embodiments, independent inductors are formed with no gap between the magnetic core parts.

In the present invention, to make the inductor packs have planar surfaces, the windings and the metal layers that cover the surfaces of the magnetic cores are damascened into the magnetic core surfaces as shown in FIGS. 3 and 4.

Figure 8:
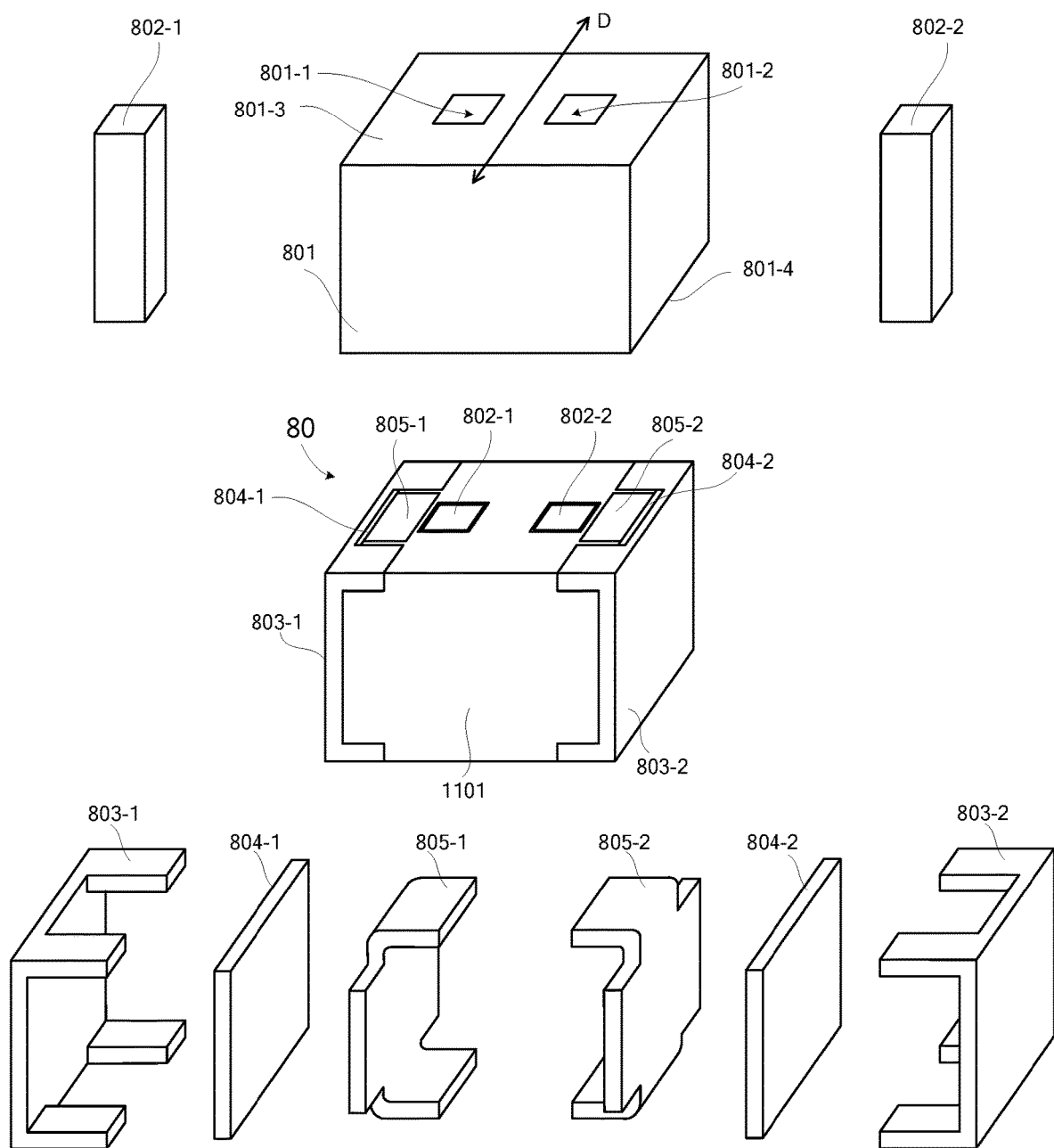
FIG. 8 shows the disassemble view of an inductor pack 80 in accordance with an embodiment of the present invention.

FIG. 8 shows the disassembled view of an inductor pack 80 in accordance with an embodiment of the present invention. The inductor pack 80 may serve as the inductor pack 206 in FIG. 2. As shown in FIG. 8, the inductor pack 80 comprises: a magnetic core 801 having two passageways 801-1 and 801-2 passing through the magnetic core 801 from a top surface 801-3 to a bottom surface 801-4 of the magnetic core 801, and wherein the two passageways are symmetrically located on two sides of a central axis "D" from a top view of the symmetrical magnetic core 801; and two windings 802-1 and 802-2 respectively passing through the two passageways 801-1 and 801-2.

In the embodiment of FIG. 8, the passageways 801-1 and 801-2 have a depth along an axis B perpendicular to the bottom PCB 201 and the top PCB 202 as shown in FIG. 2 if adopted by the power supply module 20.

In the embodiment of FIG. 8, the winding 802-1 and the winding 802-2 are straight and have bar structure.

In the embodiment of FIG. 8, each one of metal layers 803-1, 803-2, 805-1 and 805-2 has C-shape, lying against and wrapping the magnetic core 801 partially. The metal layers 803-1, 803-2, 805-1 and 805-2 are configured to solder the top PCB 202 to the bottom PCB 201. The ends of the metal layers 803-1, 803-2, 805-1 and 805-2 are bent 90 degrees and are extended to produce tabs to be soldered to the bottom PCB 201 and the top PCB 202 with minimized PCB trace impedance inside the bottom PCBs. In one embodiment, the metal layers 803-1 and 803-2 are for soldering the power pins (refer to the pins receiving the input voltage Vin in FIG. 1) of the power device chips 203 via the top PCB 202 to the bottom PCB 201 or to the mainboard PCB directly with minimized PCB trace impedance. In one embodiment, the metal layers 805-1 and 805-2 are for soldering the ground reference pins of the power device chips 203 via the top PCB 202 to the bottom PCB 201 or to the mainboard PCB directly with minimized PCB trace impedance. In the embodiment of FIG. 8, the middle of each one of the ends of the metal layers 803-1 and 803-2 are etched away, with two tabs left over, and accordingly, each one of the ends of the metal layers 805-1 and 805-2 is tailored to be placed in the middle of the corresponding two tabs of the ends of the metal layers 803-1 and 803-2 as shown in FIG. 8. As shown in FIG. 8, the metal layers 803-1 and 805-1 cover one side surface of the magnetic core 801 and lie against each other with an isolation layer 804-1 in between to avoid the electrical contact of the two metal layers. Meanwhile, the metal layers 803-2 and 805-2 cover an opposite side surface of the magnetic core 801 and lie against each other with an isolation layer 804-2 in between to avoid the electrical contact of the two metal layers. The ends of the metal layers 803-1, 803-2, 805-1 and 805-2 are bent 90 degrees and extended to have large enough area to minimize trace impedance on PCBs, and the metal layers are also wide enough to minimize the self-impedance.

It should be understood that in some embodiments, the metal layers 803-1 and 803-2 could be connected to the ground reference pin of the power devices 203 via the top PCB 202, and the metal layers 805-1 and 805-2 could be connected to the power pins of the power devices 203 via the top PCB 202. That is to say, the potentials that the metal layers 803-1, 803-2 and the metal layers 805-1, 805-2 are connected could be swapped without departing from the spirit and the scope of the present invention.

Figure 9:
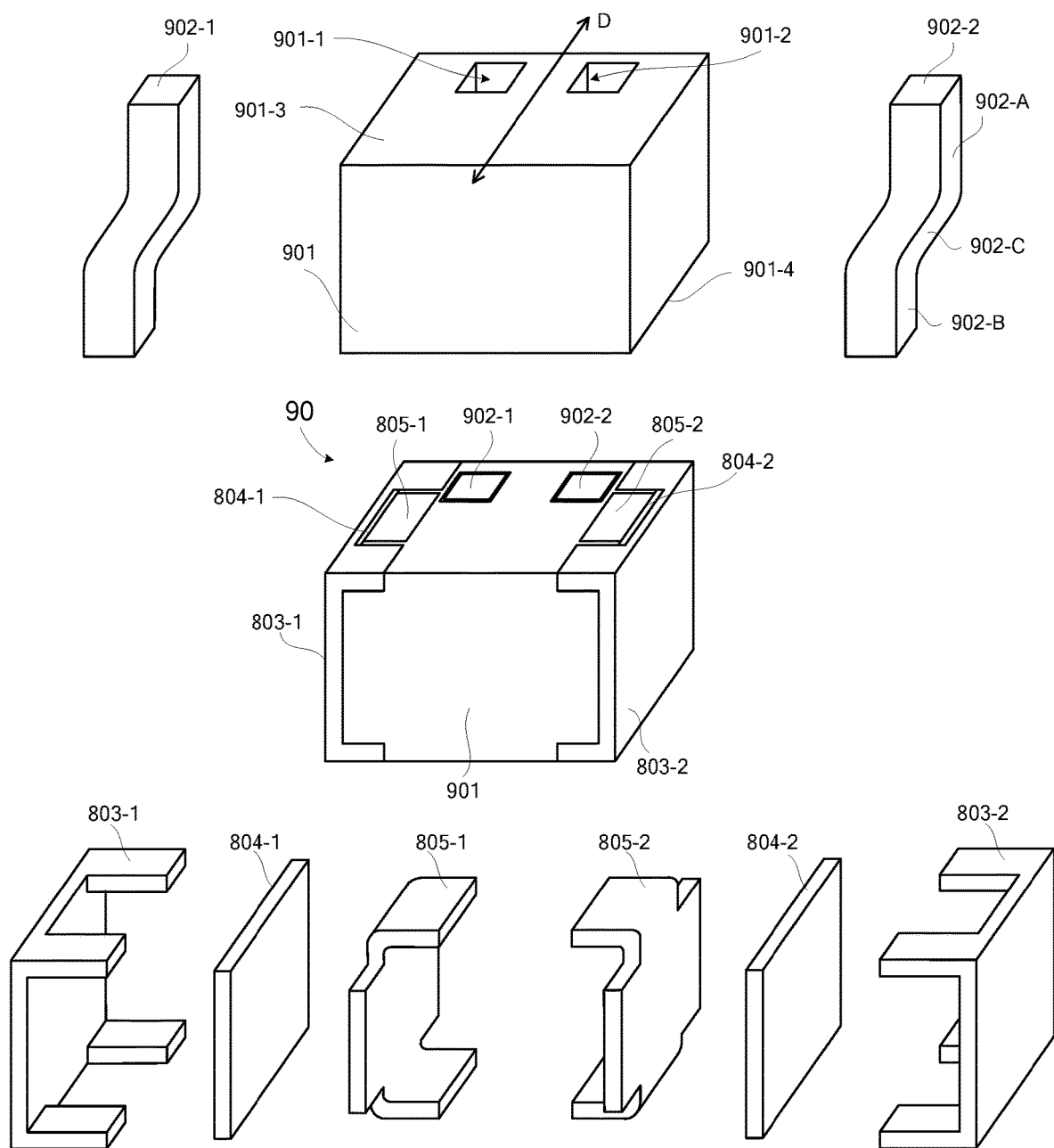
FIG. 9 shows the disassemble view of an inductor pack 90 in accordance with an embodiment of the present invention.

FIG. 9 shows the disassembled view of an inductor pack 90 in accordance with an embodiment of the present invention. The inductor pack 90 may serve as the inductor pack 206 in FIG. 2. The inductor pack 90 is similar with the inductor pack 80 in FIG. 8. The difference is that in FIG. 9, the windings 902-1 and 902-2 are not as straight as the windings 802-1 and 802-2 in FIG. 8. In FIG. 9, each one of the windings 902-1 and 902-2 comprises three sections 902-A, 902-B and 902-C, wherein the first section 902-A is extended from a top surface 901-3 of a magnetic core 901 and has a length perpendicular to the top surface 901-3, the second section 902-B is extended from a bottom surface 901-4 of the magnetic core 901 and has a length perpendicular to the bottom surface 901-4, and the third section 902-C connects the first section 902-A and the second section 902-B. In one embodiment, the third section 902-C has a length parallel to the top surface 901-3 and the bottom surface 901-4.

Figure 10:
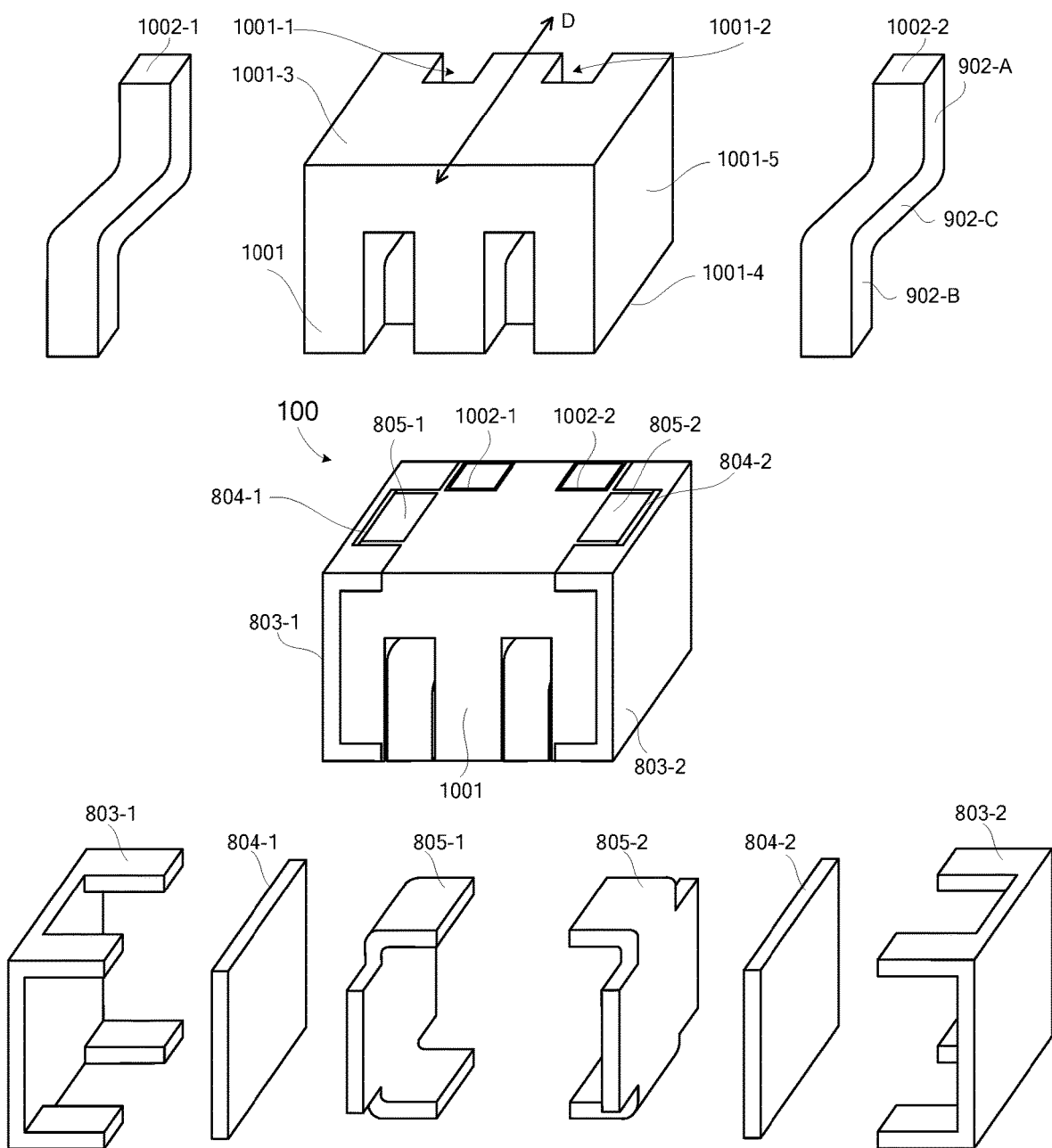
FIG. 10 shows the disassembled view of an inductor pack 100 in accordance with an embodiment of the present invention.

FIG. 10 shows the disassembled view of an inductor pack 100 in accordance with an embodiment of the present invention. The inductor pack 100 may serve as the inductor pack 206 in FIG. 2. The inductor pack 100 is similar with the inductor pack 90 in FIG. 9. The difference is that in FIG. 10, the third section 1002-C of each winding is long enough to expose the first section 1002-A and the second section 1002-B at the associated side surfaces 1001-5 of the magnetic core 1001, wherein the exposed surfaces of the windings 1002-1 and 1002-2 are aligned to the associated side surfaces of the magnetic core 1001 to make the inductor pack 100 have planar surfaces.

Figure 11:
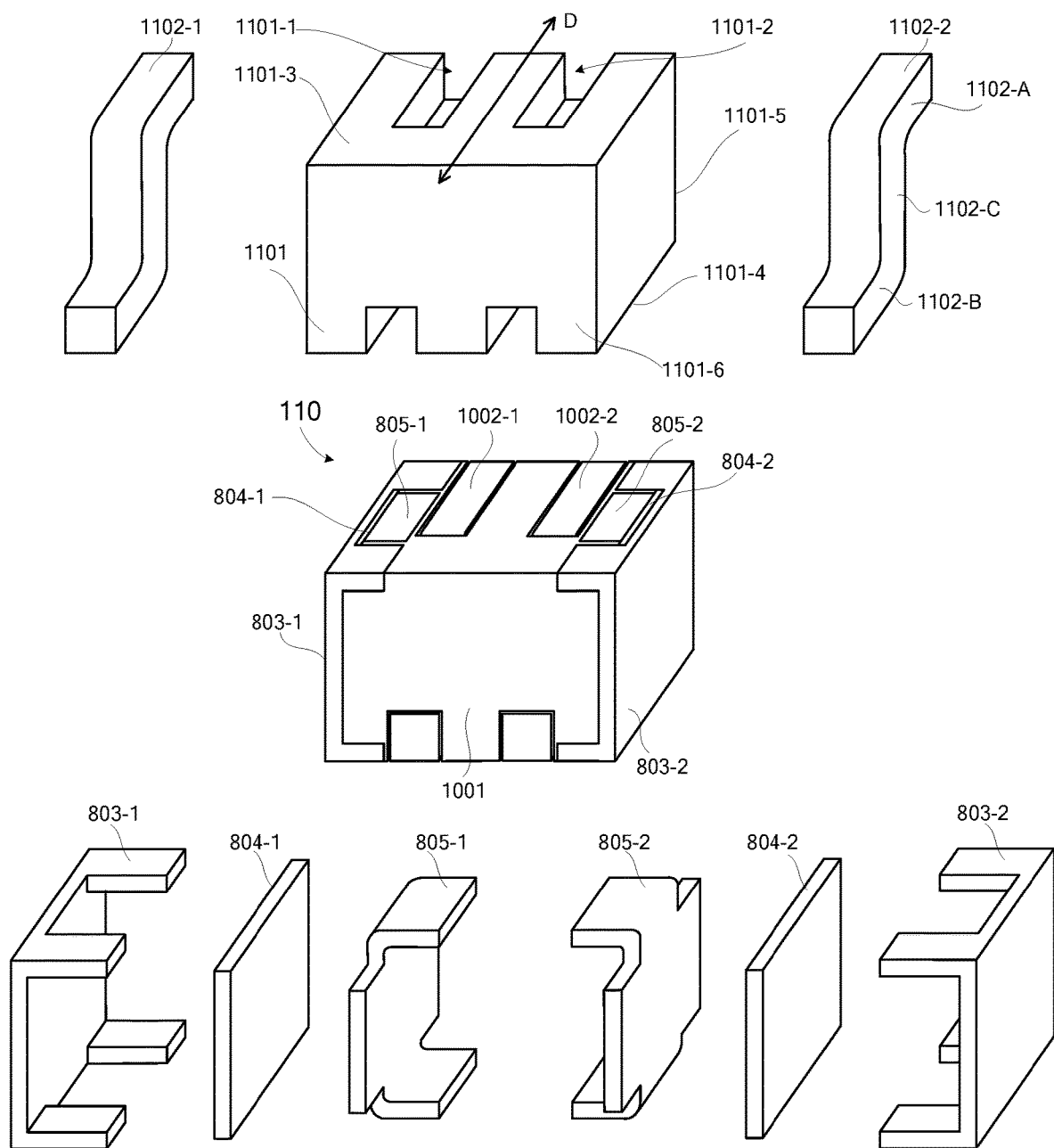
FIG. 11 shows the disassemble view of an inductor pack 110 in accordance with an embodiment of the present invention.

FIG. 11 shows the disassembled view of an inductor pack 110 in accordance with an embodiment of the present invention. The inductor pack 110 may serve as the inductor pack 206 in FIG. 2. The inductor pack 110 is similar with the inductor pack 100 in FIG. 10. The difference is that in FIG. 11, each one of the windings 1102-1 and 1102-2 comprises three sections 1102-A, 1102-B and 1102-C, wherein the first section 1102-A is extended from one of the side surfaces 1101-5 of a magnetic core 1101 and has a length parallel to the top surface 1101-3, the second section 1102-B is extended from an opposite side surface 1101-6 of the magnetic core 1101 and has a length parallel to the bottom surface 1101-4, and the third section 1102-C connects the first section 1102-A and the second section 1102-B. The first section 1102-A is exposed at the top surface 1101-3 and the exposed surface is aligned to the top surface 1101-3 to make the top surface 1101-3 planar. The second section 1102-B is exposed at the bottom surface 1101-4 of the magnetic core 1101, and the exposed surface is aligned to the bottom surface 1101-4 to make the bottom surface 1101-4 planar. In one embodiment, the third section 1102-C has a length perpendicular to the top surface 1101-3 and the bottom surface 1101-4.

Figure 12:
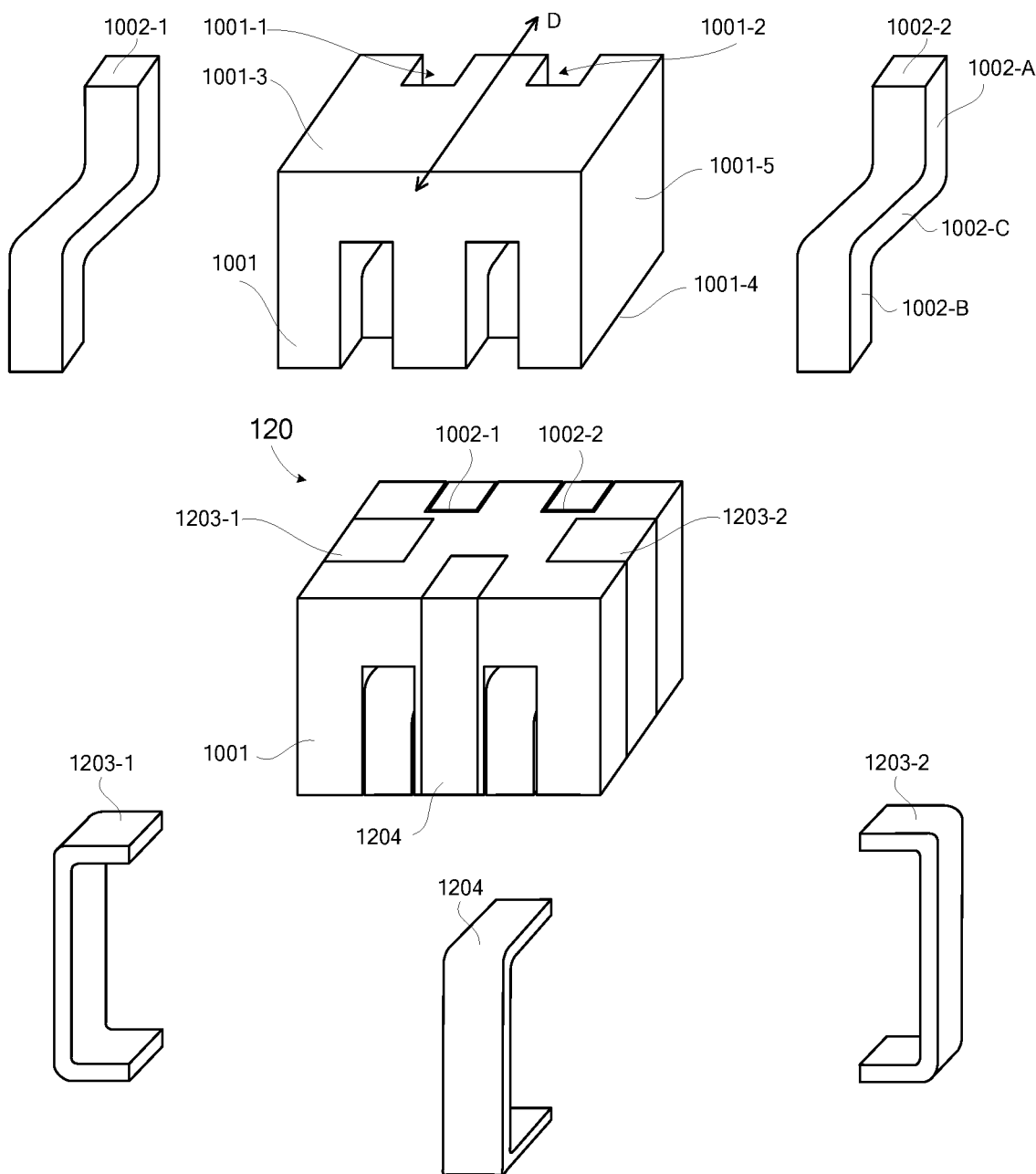
FIG. 12 shows the disassemble view of an inductor pack 120 in accordance with an embodiment of the present invention.

FIG. 12 shows the disassembled view of an inductor pack 120 in accordance with an embodiment of the present invention. The inductor pack 120 may serve as the inductor pack 206 in FIG. 2. The inductor pack 120 is similar with the inductor pack 100 in FIG. 10. The difference is that the metal layers 1203-1, 1203-2 and 1204 are not overlapped in FIG. 12. In FIG. 12, the metal layers 1203-1 and 1203-2 lie against two opposite side surfaces of the magnetic core 1001, and the metal layer 1204 lies against the remaining side surfaces, wherein each one of the metal layers 1203-1, 1203-2 and 1204 has C-shape, and has a first end bent 90 degree to cover part of a top surface 1001-3 of a magnetic core 1001, and a second end bent 90 degree to cover part of a bottom surface 1001-4 of the magnetic core 1001.

In the embodiment of FIG. 12, the metal layers 1203-1 and 1203-2 are connected to a first potential while the metal layer 1204 is connected to a second potential. For example, the first potential could be the voltage at the ground reference pin of the power devices 203, and the second potential could be the voltage at the power pins of the power devices 203, vice versa.

Figure 13:
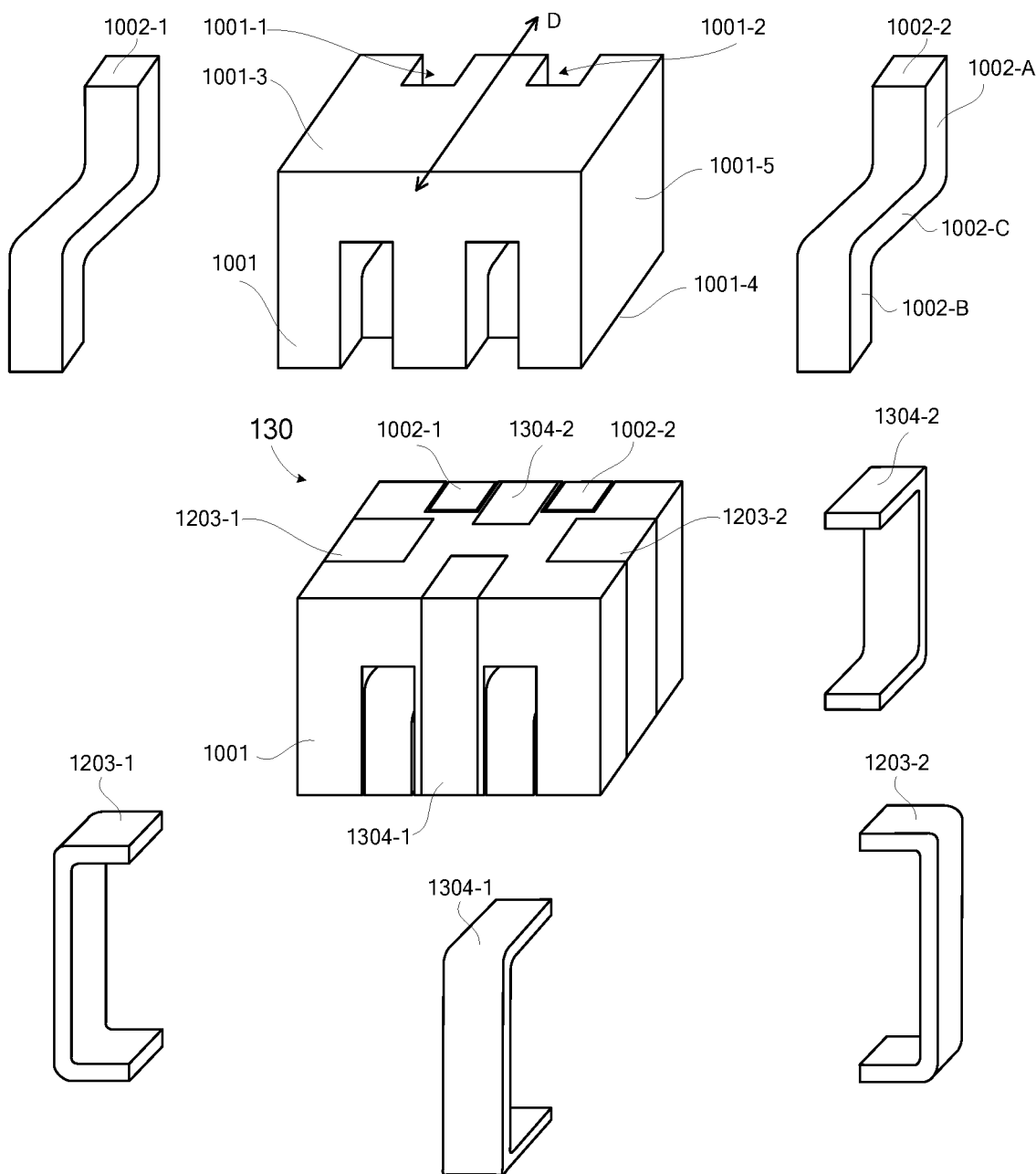
FIG. 13 shows the disassembled view of an inductor pack 130 in accordance with an embodiment of the present invention.

FIG. 13 shows the disassembled view of an inductor pack 130 in accordance with an embodiment of the present invention. The inductor pack 130 may serve as the inductor pack 206 in FIG. 2. The inductor pack 130 is similar with the inductor pack 120 in FIG. 12. The difference is that the inductor pack 130 comprises more metal layers, i.e., the inductor pack 130 comprises the metal layers 1203-1, 1203-2, 1304-1 and 1304-2. In FIG. 13, the metal layers 1203-1 and 1203-2 lie against two opposite side surfaces, and the metal layers 1304-1 and 1304-2 lies against the other two opposite side surfaces, wherein the metal layers 1203-1 and 1203-2 are connected to the first potential, and the metal layers 1304-1 and 1304-2 are connected to the second potential. Similar with the metal layers in FIG. 12, each one of the metal layers 1203-1, 1203-2, 1304-1 and 1304-2 has C-shape, and has a first end bent 90 degree to cover part of the top surface 1001-3 of the magnetic core 1001, and a second end bent 90 degree to cover part of the bottom surface 1001-4 of the magnetic core 1001. More metal layers provide more flexibility to the pad distribution of the top PCB 202 and the bottom PCB 201, or the mainboard PCB that the power supply module attached to.

The metal layers in the different embodiments may have different patterns to wrap the magnetic cores in the present invention. Also, when the shapes of the magnetic cores change, the patterns of the metal layers changed accordingly. It should be understood that all the metal layers and all the windings are spaced away to avoid electrical contact, i.e., avoid short circuit.

In some embodiments, some or all of the metal layers in FIGS. 8-13 may have other shapes, e.g., L-shape, having one of the ends extended to cover the top surface or the bottom surface of the magnetic core, like the metal layers 305-1 and 305-2 in FIG. 3. In some embodiments, some or all of the metal layers in FIGS. 8-13 maybe a planar, with no ends bent. Furthermore, in some embodiments, metal layers with different patterns may be composed together with isolation layer in between.

In the present invention, the windings pass through the associated passageways inside the magnetic core, which means the passageways have the consistent shapes with the windings. In some embodiments, the windings are shaped firstly, and then proper material are molded to wrap the windings to form the magnetic core.

In some embodiments of the present invention, the magnetic cores are coated by epoxy resin to electrically insulate the magnetic cores from the metal layers wrapping the magnetic cores.

In the present invention, to make the inductor packs have planar surfaces, part of the windings and the metal layers that cover the surfaces of the magnetic cores are damascened into the magnetic core surfaces as shown in the inductor packs in FIGS. 3, 4 and 8-13.

As shown in FIG. 2, the sandwich structure power supply module 20 comprises the inductor pack 206 and the connector 204 having a plurality of metal pillars 205 respectively connecting solder pads on the bottom PCB to solder pads on the top PCB. That is to say, the inductor pack 206 and the connector 204 are two independent components packed together between the top PCB and the bottom PCB. During manufacturing process, height error tolerance between the inductor pack 206 and the connector 204 is limited, and efforts are required to align the inductor pack 206 and the connector 204 too.

Figure 14:
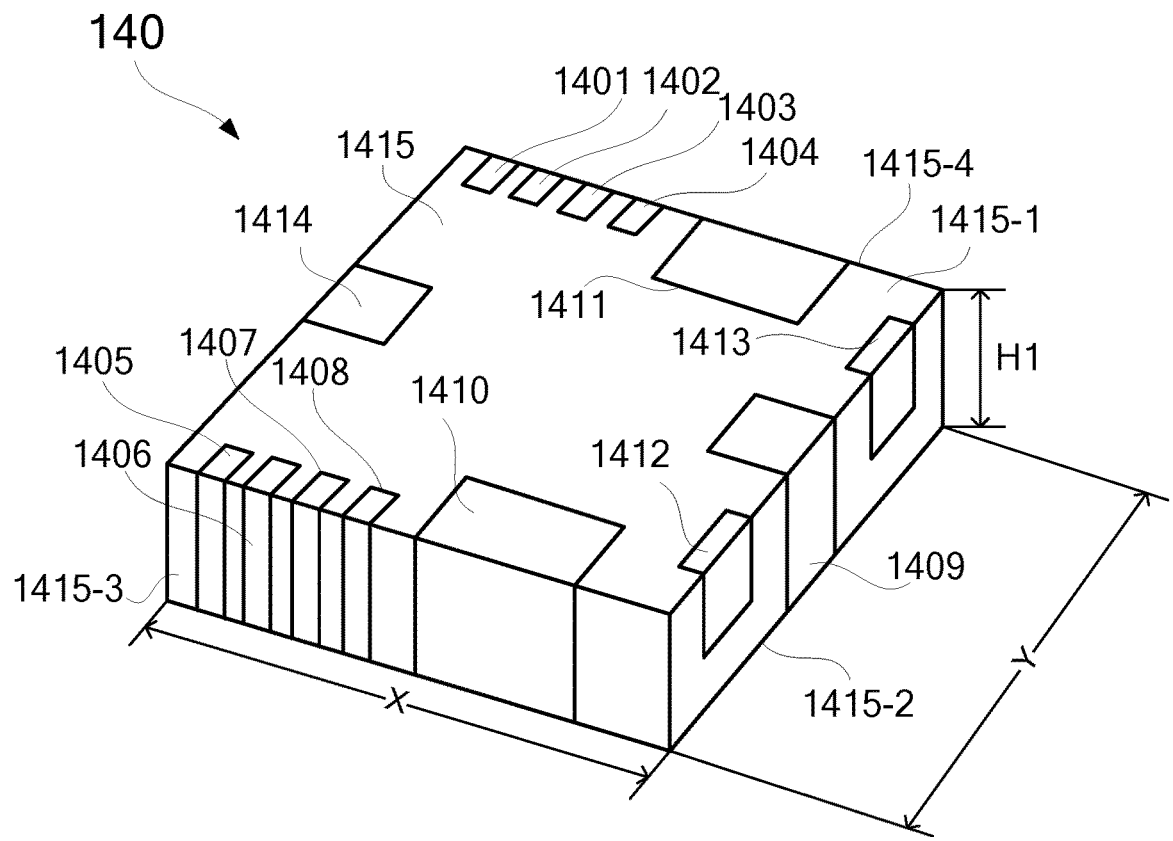
FIG. 14 shows an inductor module 140 in accordance with an embodiment of the present invention.

FIG. 14 shows an inductor module 140 in accordance with an embodiment of the present invention. The inductor module 140 integrates the inductor pack and the connector together in a single module. The connector is implemented by the signal pins 1401~1408, i.e., the metal layer covers the surfaces of the inductor module 140. In one embodiment, the inductor module 140, instead of the inductor pack 206 and the connector 204 in FIG. 2, is integrated to the power supply module between the top PCB and the bottom PCB.

Compared with the inductor pack 206 in the aforementioned embodiments, the inductor module 140 is extended in the horizontal direction, and is reduced in the vertical direction. The horizontal extension provides surfaces to be covered by the signal pins 1401~1409. Furthermore, the horizontal extension of the inductor module 140 prolongs the passageways and the windings compared with the aforementioned inductor pack, thus increases the inductance of the inductor module 140 when the height of the inductor module 140 remains the same with the height of the inductor packs in the aforementioned embodiments, and could maintain a sufficient inductance and low resistance even when the height of the inductor module is reduced compared with the inductor pack 206.

In the embodiment of FIG. 14, the inductor module 140 comprises two inductors, wherein each one of the inductors is implemented by a magnetic core 1415 and one of the windings 1412 and 1413 passing through passageways of the magnetic core 1415. The two inductors could be one couple inductor in some embodiments. The windings 1412 and 1413 have the same structure with the windings in FIGS. 9, 10, 12 and 13, i.e., each one of the windings 1412 and 1413 has a first end that connects out to a top side 1415-1 of the inductor module 140, and has a second end that connects out to a bottom side 1415-2 of the inductor module 140. The first ends of the windings 1412 and 1413 are respectively connected to the power device chips 203 via the top PCB. The second ends of the windings 1412 and 1413 are connected to the bottom PCB, or connected to a mainboard PCB when the bottom PCB is saved.

In FIG. 14, the cross section of each one of the windings 1412 and 1413 has a rectangle shape, which prolongs the effective length of the windings compared with the square shape, when having the same area. Moreover, the rectangle shaped cross section of the windings reduces the skin effect copper loss of ripple current, and reduces the length difference between the magnetic paths of the windings and the magnetic core surrounding the windings. The long sides of the rectangle cross section at the top side surface 1415-1 of the inductor module 140 lie along the direction "Y" perpendicular to the length of the windings 1412 and 1413, and the short sides of the rectangle cross section at the top side surface 1415-1 of the inductor module 140 lie along the direction "X" parallel to the length of the windings 1412 and 1413. In other embodiments, the windings 1412 and 1413 may have structures shown in FIGS. 3-5 and 11, then the passageways of the inductor module, and the metal layer on the surface of the module are adjusted accordingly.

In the embodiment of FIG. 14, the inductor module 140 is extended along the direction of the length of the passageways that the windings 1412 and 1413 pass through. The signals pins are distributed at the side surfaces 1415-3 and 1415-4 of the inductor module 140 that parallel to the length of the passageways. The side surfaces 1415-3 and 1415-4 are opposite and are parallel to the direction "X" of the length of the windings 1412 and 1413. In one embodiment, the signal pins at the side surface 1415-3 are connected to the power device chip placed near the side surface 1415-3, on the top of the power supply module, and the signal pins at the side surface 1415-4 are connected to the other power device chip placed near the side surface 1415-4, on the top of the power supply module.

In the embodiment of FIG. 14, the signal pins 1401~1408 are metal layers having C-shape and wrapping the magnetic core 1415, with the two ends respectively lies on the top surface and the bottom surface of magnetic core 1415, for being soldered to the top PCB and the bottom PCB. The bottom PCB could be omitted, in which case that the inductor module 140 is soldered to the mainboard that the load powered by the power supply module located on.

In the example of FIG. 14, the signal pins 1401 and 1405 are configured to respectively receive PWM signals to the power device chips 203 via the top PCB as shown in FIG. 2. The signal pins 1402 and 1406 are configured to respectively provide current sense signals from the power device chips 203 via the top PCB. The signal pins 1403 and 1407 are configured to respectively provide temperature monitoring signals from the power device chips 203 via the top PCB. The signal pins 1404 and 1408 are configured to respectively receive enable signals to the power device chips 203 via the top PCB. The metal layers 1409, 1410, 1411 and 1414, i.e., the power pins, are configured to different potentials of the power supply module. For example, the metal layer 1409 may be connected to the input voltage Vin of the power device chips 203, the metal layers 1410 and 1411 are connected to the ground reference, and the meal layer 1414 may be connected to a VCC power supply for powering the power device chips 203.

It should be known that the pins on the inductor module 140 are for illustration purpose. More pins or less pins could be configured, and the distribution of the pins could be adjusted according to the applications, to obtain the optimum current path of the inductor module 140 to the load powered by the power supply module.

Compared with the inductor packs in the aforementioned embodiments, the inductor module 140 in FIG. 14 provides the similar inductance with much lower height. The height of the inductor packs in the embodiments of FIGS. 3-5 and 8-13 are in a range of 5 mm~8 mm. The height H1 of the inductor module 140 is in a range of 1 mm~3 mm, typically 2 mm. The lower height of the inductor module 140 results in a lower height power supply module in which the inductor module 140 is utilized, thus makes it possible to place the power supply module on the back side of the mainboard/PCB where the load is located. That is to say, the power supply module is placed beneath the load with the mainboard/PCB in between, which greatly shorts the current path and reduces the power distribution lost.

Figure 15:
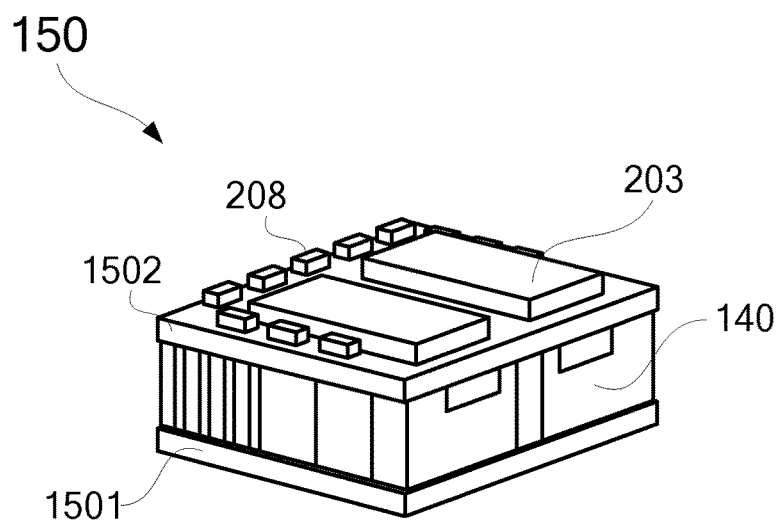
FIG. 15 schematically shows a power supply module 150 in accordance with an embodiment of the present invention.

FIG. 15 schematically shows a power supply module 150 in accordance with an embodiment of the present invention. As shown in FIG. 15, the power supply module 150 comprises a bottom PCB 1501, a top PCB 1502, the inductor module 140, the power device chips 203 and a plurality of discrete components 208 distributed on the top PCB 1502 near the power device chips 203. As mentioned in the previous embodiments, the bottom PCB 1501 could be saved. As shown in FIG. 15, removing the connector simplifies the power supply module structure, improves the integration, and thus improves the manufacturing process.

Figure 16:
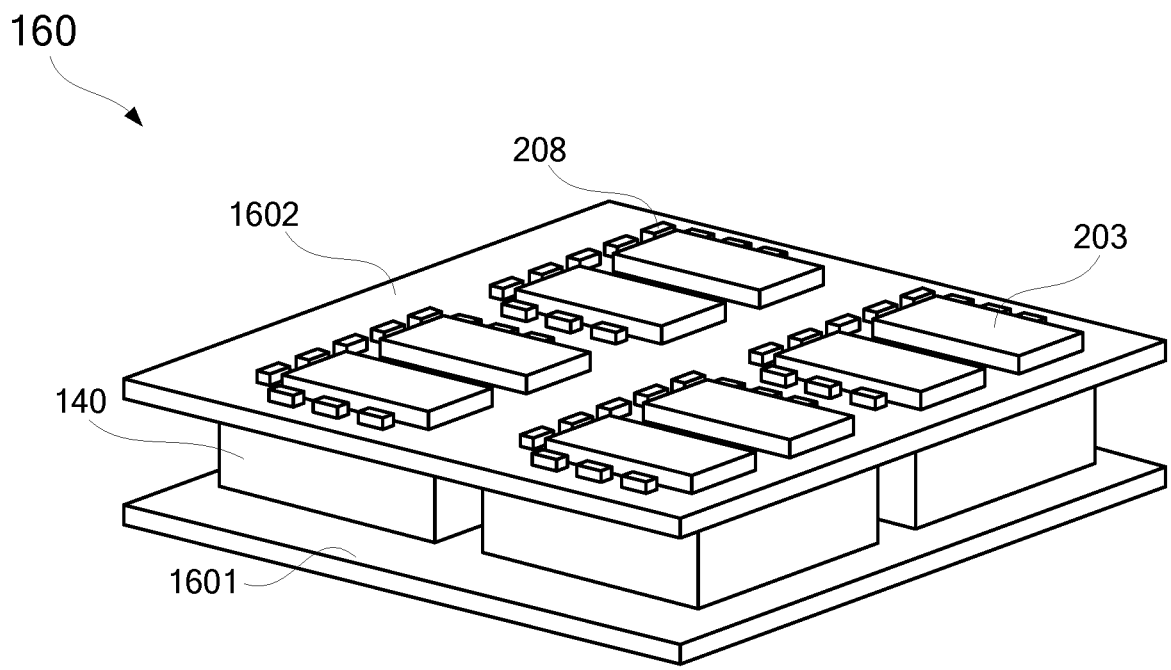
FIG. 16 schematically shows a power supply module 160 in accordance with an embodiment of the present invention.

FIG. 16 schematically shows a power supply module 160 in accordance with an embodiment of the present invention. Compared with the power supply module 150 in FIG. 15, the power supply module 160 in FIG. 16 is scaled to include four inductor modules 140 between a top PCB 1602 and a bottom PCB 1601. And it should be understood that in other embodiments, a power supply module could be scaled to include more inductor modules with a similar structure shown in FIG. 16.

Figure 17:
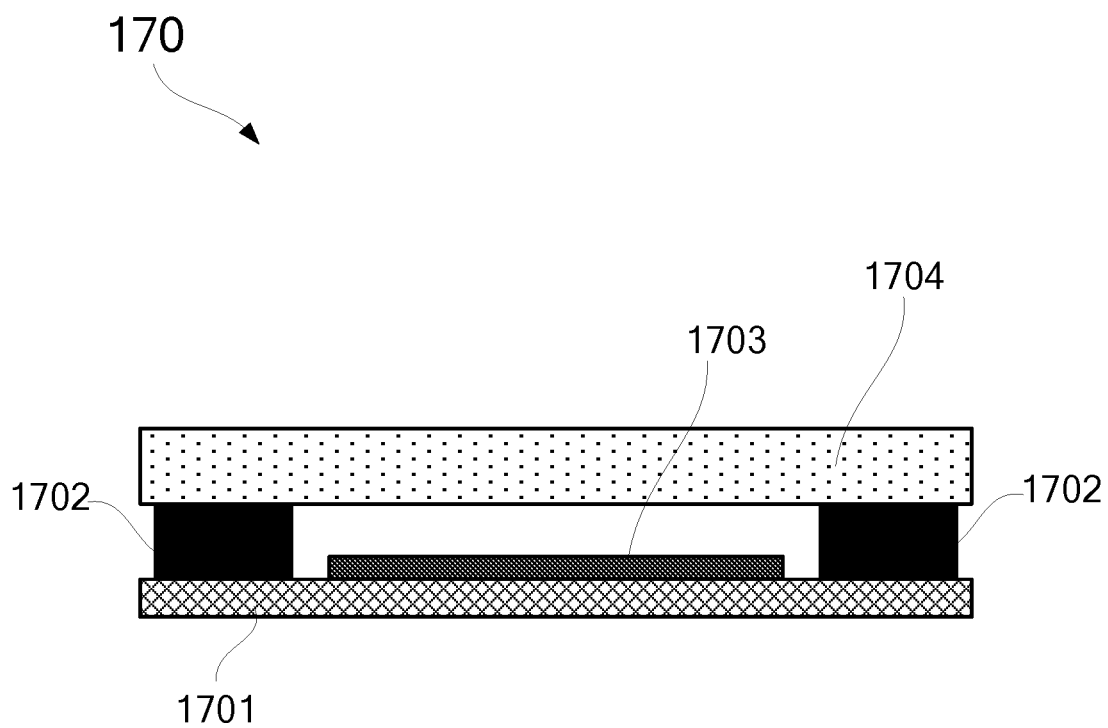
FIG. 17 schematically shows a processor system 170 in accordance with an embodiment of the present invention.

FIG. 17 schematically shows a processor system 170 in accordance with an embodiment of the present invention. As shown in FIG. 17, the processor system 170 comprises a mainboard 1701, power supply modules 1702, a load 1703 and a top side cooling system 1704. Each one of the power supply modules 1702 in FIG. 17 could be the power supply module 150 in FIG. 15, the power supply module 160 in FIG. 16, or a power supply module with more inductor modules. The bottom of the power supply module 1702, or the bottom of the inductor module 140, is soldered to a mainboard where the load located directly. The load 1703 comprises GPU, CPU, etc. The top side cooling system 1704 comprises a heat sink and is placed above the power supply modules 1702 and the load 1703. Ideally, the top side cooling system 1704 contacts the load 1703 and the power supply modules 1702 to achieve excellent heat transfer. However, in real applications, as shown in FIG. 17, the power supply module 1702 is usually higher than the load 1703. In this case, there is an interspace between the top side cooling system 1704 and the load 1703. Thus, the larger the interspace is, the worse the heat transfer effect is. In a conclusion, it is better to reduce the height of the power supply module 1702, so that to short the distance between the top side cooling system 1704 and load 1703. The power supply module 1702 in FIG. 17 comprises the inductor module 140 and is much lower than the traditional power supply modules. As mentioned before, the height H1 of the inductor module 140 is in a range of 1 mm~3 mm. Thus, compared with the power supply module utilizing the traditional inductor packs, the height of the power supply modules 1702 is reduced by 2 mm~7 mm, which greatly improves the heat transfer capacity.

Figure 18:
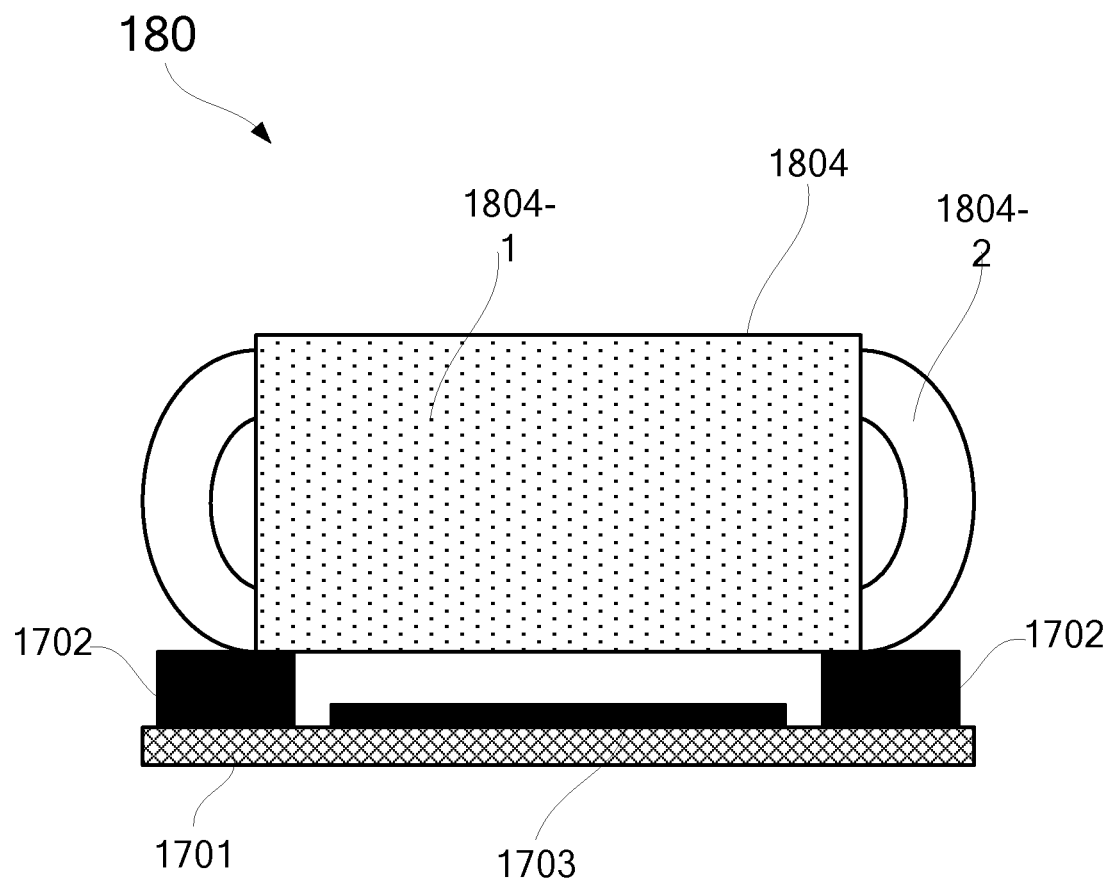
FIG. 18 schematically shows a processor system 180 in accordance with an embodiment of the present invention.

FIG. 18 schematically shows a processor system 180 in accordance with an embodiment of the present invention. Compared with the processor system 170 in FIG. 17, a top side cooling system 1804, instead of the top side cooling system 1704 is adopted. The top side cooling system 1804 comprises a heat pipe radiator. The heat pipe radiator, i.e., the top side cooling system 1804, includes a container 1804-1 and pipes 1804-2. The pipes 1804-2 are bended at the ends as shown in FIG. 18. The power supply modules 1702 are placed under the top side cooling system 1804. When the distance between the top side cooling system 1804 and the load 1703 is fixed, the lower the power supply modules 1702 is, the closer the power supply modules 1702 is placed to the load 1703. It should be understood that, the distance between the load 1703 and power supply modules 1702 determines the length of the current path and thus determines the power distribution loss. The power supply module 1702 comprises the inductor module 140 and is much lower than the traditional power supply modules. As a result, in the example of FIG. 18, the low height power supply module brings benefits of the reduced current paths and minimized power distribution lost.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A power supply module, comprising: at least one inductor modules, wherein each inductor module has a magnetic core and two windings passing through the magnetic core; a top PCB (Printed Circuit Board) mounted on top of the at least one inductor modules; and at least one pair of power device chips mounted on top of the top PCB, wherein each pair of the at least one pair of the power device chips are mounted on the too PCB over an associated inductor module, and wherein each one of the pair of the power device chips has at least one pin connected to the associated winding of the associated inductor module via the top PCB: wherein each of the at least one inductor modules is wrapped by a plurality of metal layers configured as power pins and signal pins for connecting the top PCB and a board that the inductor module is attached to; and further wherein each inductor module has a height measured from a surface of a bottom side of the inductor module to a surface of a top side of the inductor module of at most 3 mm.

2. The power supply module of claim 1, wherein in one inductor module, each one of the windings has a first end that connects out to a top side of the inductor module, and has a second end that connects out to a bottom side of the inductor module, and wherein the top side of the inductor module is covered by the top PCB.

3. The power supply module of claim 1, wherein the signal pins are distributed at a first side surface and a second side surface of the inductor module, and wherein the first side surface and the second side surface are opposite and are parallel to a direction of a length of the windings of the inductor module.

4. The power supply module of claim 3, wherein for each inductor module, the signal pins at the first side surface of the inductor module are connected to the power device chip placed near the first side surface, and the signal pins at the second side surface of the inductor module are connected to the power device chip placed near the second side surface.

5. The power supply module of claim 1, wherein at least one of the power pins is configured to receive an input voltage of the power supply module.

6. The power supply module of claim 1, wherein at least one of the power pins is configured to receive a ground reference.

7. The power supply module of claim 1, wherein at least one of the power pins is configured to receive a power supply voltage for powering the power device chips.

8. The power supply module of claim 1, wherein the board that the inductor module is attached to is a PCB.

9. An inductor module, comprising: a magnetic core having at least one passageways; at least one windings respectively passing through the at least one passageways of the magnetic core; a plurality of metal layers covering the magnetic core, wherein each of the metal layers has C-shape and wraps part of side surfaces of the magnetic core, with a first end bended and covers part of a top side of the magnetic core, and a second end bended and covers part of a bottom side of the magnetic core, and wherein the metal layers are configured as power pins and signal pins; and wherein the inductor module having a height measured from a surface of the bottom side of the inductor module to a surface of the top side of the inductor module of at most 3 mm.

10. The inductor module of claim 9, wherein each one of the windings has a first end that connects out to the top side of the inductor module, and has a second end that connects out to the bottom side of the inductor module.

11. The inductor module of claim 9, wherein the signal pins are distributed at a first side surface and a second side surface of the inductor module, and wherein the first side surface and the second side surface are opposite and are parallel to a direction of a length of the windings of the inductor module.

12. The inductor module of claim 9, wherein the at least one of the power pins is configured to receive an input voltage of a power supply module that the inductor module is utilized with.

13. The inductor module of claim 9, wherein the at least one of the power pins is configured to receive a ground reference of a power supply module that the inductor module is utilized with.

14. The inductor module of claim 9, wherein the at least one of the power pins is configured to receive a power supply voltage for powering power device chips utilized with the inductor module in a power supply module.

15. A processor system, comprising: a mainboard PCB; a load mounted on the mainboard PCB: at least one power supply modules mounted on the mainboard PCB near the load, wherein each of the at least one power supply modules has: an inductor module having a magnetic core and at least one windings passing through the magnetic core; a top PCB mounted on top of the inductor module; and at least one power device chips mounted on top of the top PCB, wherein each one of the at least one power device chips has at least one pin connected to the associated winding via the top PCB; wherein the inductor module is wrapped by a plurality of metal layers configured as power pins and signal pins for connecting the top PCB and the mainboard PCB; and a top side cooling system placed on the load and the power supply module; wherein the load is powered by the power supply module; and further wherein the inductor module has a height measured from a surface of the bottom side of the inductor module to a surface of the top side of the inductor module of at most 3 mm.

16. The processor system of claim 15, wherein each one of the windings has a first end that connects out to a top side of the inductor module, and has a second end that connects out to a bottom side of the inductor module, and wherein the top side of the inductor module is covered by the top PCB.

17. The processor system of claim 15, wherein the signal pins are distributed at two opposite side surfaces of the inductor module which are parallel to a length of the passageways of the inductor module.

* * * * *